United States Patent [19]

Stone, Jr.

[11] 4,107,629
[45] Aug. 15, 1978

[54] TEMPERATURE COMPENSATOR FOR A CRYSTAL OSCILLATOR

[75] Inventor: Russell L. Stone, Jr., Lynchburg, Va.

[73] Assignee: General Electric Company, Lynchburg, Va.

[21] Appl. No.: 796,888

[22] Filed: May 16, 1977

[51] Int. Cl.² ............................................. H03B 5/36
[52] U.S. Cl. ................................. 331/116 R; 331/176
[58] Field of Search ............... 331/116 R, 176, 175, 331/177 V; 310/8.1, 8.9

[56] References Cited

U.S. PATENT DOCUMENTS

| | | | |
|---|---|---|---|
| 3,054,966 | 9/1962 | Etherington | 331/176 |
| 3,322,981 | 5/1967 | Brenig | 331/116 |
| 3,373,379 | 3/1968 | Black | 331/116 |
| 3,397,367 | 8/1968 | Steel et al. | 331/176 |
| 3,404,297 | 10/1968 | Fewings et al. | 331/116 |
| 3,454,903 | 7/1969 | Page | 331/176 |
| 3,508,168 | 4/1970 | Chan | 331/116 |
| 3,523,258 | 8/1970 | Niemoeller et al. | 331/116 |
| 3,831,111 | 8/1974 | Lafferty | 331/176 |
| 3,970,966 | 7/1976 | Keller | 331/116 |
| 4,020,426 | 4/1977 | Helle | 331/176 |
| 4,051,466 | 9/1977 | Owaki | 331/176 |

Primary Examiner—John Kominski
Attorney, Agent, or Firm—James J. Williams

[57] ABSTRACT

Crystal oscillators have been provided with a voltage sensitive capacitor or varactor which can be varied to improve the frequency stability of the oscillator over the desired range of temperature. A temperature compensator is provided for varying the voltage applied to the voltage sensitive capacitor as a function of temperature. The temperature compensator has a middle temperature range circuit, a cold temperature range circuit, and a hot temperature range circuit. The compensator can be constructed as an integrated circuit with external resistors which can be varied (or trimmed), and provides compensating voltages that stabilize the oscillator frequency over a wide range of temperatures.

12 Claims, 3 Drawing Figures

TEMPERATURE COMPENSATOR FOR A CRYSTAL OSCILLATOR

CROSS-REFERENCE TO RELATED APPLICATION

This application relates to an application entitled "Temperature Compensator for a Crystal Oscillator" filed Apr. 14, 1977, Ser. No. 787,428, and assigned to the General Electric Company.

BACKGROUND OF THE INVENTION

My invention relates to a temperature compensator for a crystal oscillator having a voltage sensitive capacitor or varactor, and particularly to a temperature compensator for controlling the voltage applied to such a voltage sensitive capacitor, and hence for providing improved oscillator frequency stability over a wide range of temperatures.

In radio communication and electronic equipment piezoelectric crystals are used almost exclusively as the frequency determining element. As the technology in this field has expanded, the desired frequency stability of the piezoelectric crystals with respect to temperature has steadily increased. Thus, in oscillators using piezoelectric crystals, it is now fairly common to have a frequency stability of plus or minus five parts per million ($\pm 5$ ppm) over a temperature range between $-30°$ C and $+80°$ C. (As used herein, frequency stability stated in parts per million indicates the maximum frequency variation from a crystal's center frequency over a given temperature range. Thus, if a crystal is specified to have a center frequency of 8 megahertz and a stability of $\pm 2$ ppm for a given temperature range, this means that the crystal frequency will not vary more than 2/1,000,000 times 8,000,000 hertz, or $\pm 16$ Hertz over that temperature range.)

Accordingly, a primary and general object of my invention is to provide a new and improved temperature compensator for a crystal oscillator.

Another and fairly specific object of my invention is to provide a new and improved temperature compensator that can maintain the frequency stability of a crystal oscillator to within $\pm 2$ ppm over a temperature range of $-30°$ C to $+80°$ C.

Temperature compensators using temperature sensitive resistors (or thermistors) have been provided in the past. Generally, these thermistors cannot be adjusted or trimmed, so that additional and fairly complex circuits must be provided to adjust the compensator for any differences between the thermistors.

Accordingly, another object of my invention is to provide a new and improved temperature compensator that does not require thermistors.

Another object of my invention is to provide a new and improved temperature compensator that can be built in integrated circuit form and provided with external components that can be easily adjusted so that the compensator has the desired compensation characteristics.

SUMMARY OF THE INVENTION

Briefly, these and other objects are achieved by a temperature compensator in accordance with my invention for use with a crystal controlled oscillator having a voltage sensitive capacitor (or varactor). My temperature compensator responds to various temperatures over a wide temperature range, and provides a voltage for the voltage sensitive capacitor so as to maintain a stable oscillator frequency over that temperature range. My temperature compensator comprises voltage source terminals and compensating voltage output terminals. The output terminals are for connection to the voltage sensitive capacitor. A middle temperature range circuit is connected between the source terminals, and comprises a current source circuit with a first path and a load path connected in series with the current source circuit. A temperature sensitive diode is connected to the first path for increasing the current through the load path in response to warmer temperature, and for decreasing the current through the load path in response to cooler temperature. A cold temperature range circuit is connected between the source terminals, and comprises a current source circuit having a first path and a load path connected in series with the current source circuit. A temperature sensitive diode is connected to the current source circuit for increasing the current through the load path in response to colder temperature, and for decreasing the current through the load path in response to warmer temperature. A hot temperature range circuit is connected between the source terminals, and comprises a current source circuit having a first path and a load path connected in series with the current source circuit. A temperature sensitive diode is connected to the current source circuit for decreasing the current through the load path in response to hotter temperatures and for increasing the current through the load path in response to cooler temperature. Means are connected to each of the load paths for deriving compensating signals. The compensator can be constructed in integrated circuit form with the middle, cold, and hot temperature range circuit resistors placed on the outside for adjustment. Such external placement permits the temperature compensator to be adjusted to provide the desired temperature characteristics. This adjustment is relatively easy, rapid, and reliable.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF A PREFERRED EMBODIMENT

Persons skilled in the crystal oscillator art are all too familiar with the variations in natural frequency which a piezoelectric crystal undergoes as the temperature of the crystal changes. An example is shown by the curve 10 of FIG. 1 in U.S. Pat. No. 3,831,111 granted Aug. 20, 1974. That curve 10 shows that for a wide range of temperatures, as is common for much electronic equipment today, the frequency stability of the crystal varies over rather wide extremes. And where the crystal frequency stability determines the overall frequency stability of the electronic equipment, it will be seen that such electronic equipment may have a wide frequency variation. One solution which has been provided by persons skilled in the art is to shift or rotate the crystal frequency stability characteristic about the stability pivot point. With respect to the curve 10 of the patent, this means rotating the curve 10 in a counterclockwise direction so that the crystal stability takes the form shown by the curve 11 in the patent. The curve 11 is fairly flat or fixed near the stability pivot point. However, this rotation requires the use of an inverse temperature sensitive capacitor connected into the oscillator circuit. Furthermore, the resultant rotation reduces the frequency stability at temperatures below about −5° C and above about +55° C. My invention provides compensation for a crystal without requiring that the crystal stability be rotated with an inverse temperature sensitive capacitor, and without requiring a temperature sensitive resistor or thermistor.

Figure 1:
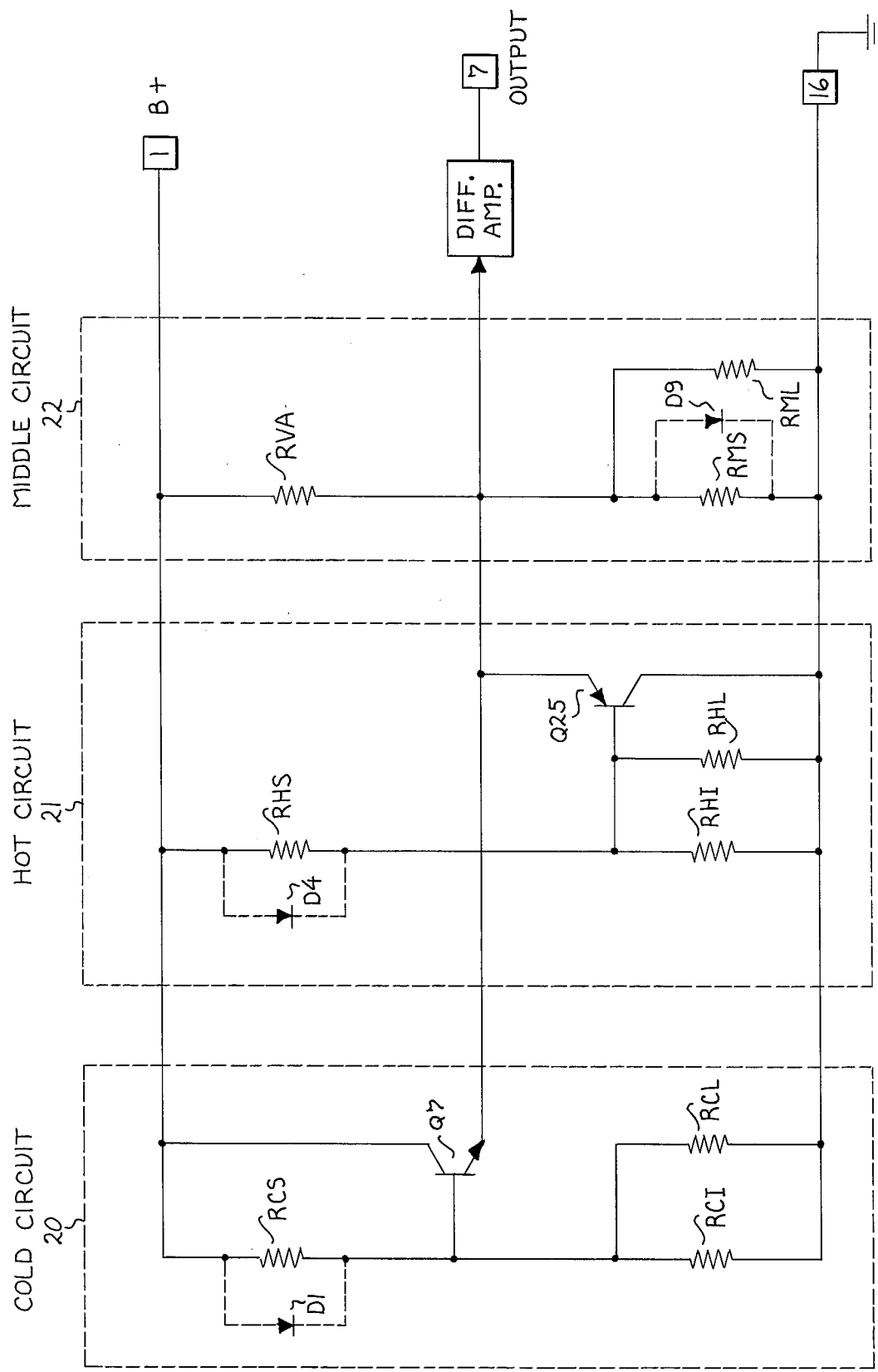
FIG. 1 shows a simplified diagram of a preferred embodiment of a temperature compensator in accordance with my invention.

FIG. 1 shows a simplified diagram of my compensator which will be briefly explained. Then, my compensator shown in the detailed circuit diagram of FIG. 2 will be explained. With reference to FIG. 1, my compensator comprises a middle temperature range compensating circuit 22, a cold temperature range compensating circuit 20, and a hot temperature range compensating circuit 21 shown enclosed in dashed lines. My compensator utilizes a source of direct current voltage B+ provided at a terminal 1 with respect to ground or reference potential at terminal 16. Compensating output voltages are derived at an output terminal 7 with respect to ground. In the middle circuit 22, a current source circuit including a voltage adjusting resistor RVA is connected in series with a first path including a slope resistor RMS and a load path including a resistor RML. A temperature sensitive diode D9 is connected (shown in a symbolic way by dashed lines) to the first path so that as the temperature of the diode D9 increases, more current passes through the load path resistor RML; and so that as the temperature of the diode D9 decreases, less current passes through the load path resistor RML. In the cold circuit 20, a current source circuit including a source resistor RCS is provided and connected in series with a first path having a resistor RCI and a load path having a resistor RCL. A temperature sensitive diode D1 is connected (shown in a symbolic way by dashed lines) to the current source circuit so that as the temperature of the diode D1 decreases or gets colder, more current is provided and passes through the load path resistor RCL; and so that as the temperature of the diode D1 increases or gets warmer, less current passes through the load path resistor RCL. The hot circuit 21 functions in a similar manner, so that as the temperature of the diode D4 increases or gets hotter, less current passes through the load path resistor RHL; and so that as the temperature of the diode D4 decreases or gets cooler, more current passes through the load path resistor RHL.

The compensating voltage from the cold circuit 20 is derived from a buffer transistor Q7 and applied to a differential amplifier. The compensating voltage from the hot circuit 21 is derived from a buffer transistor Q25 and applied to the same differential amplifier. The compensating voltage from the middle circuit 22 is applied directly to the differential amplifier. The compensation from these three circuits 20, 21, 22 is provided to a large extent by the voltage drop across their respective diodes. This voltage drop decreases linearly as the temperature of the diode rises, typically at a rate of 2 milli-volts per degree centigrade. The slopes of the compensating voltages and their respective points of intersection between the temperature ranges is obtained through adjustment or trimming of the various resistors.

Figure 2:
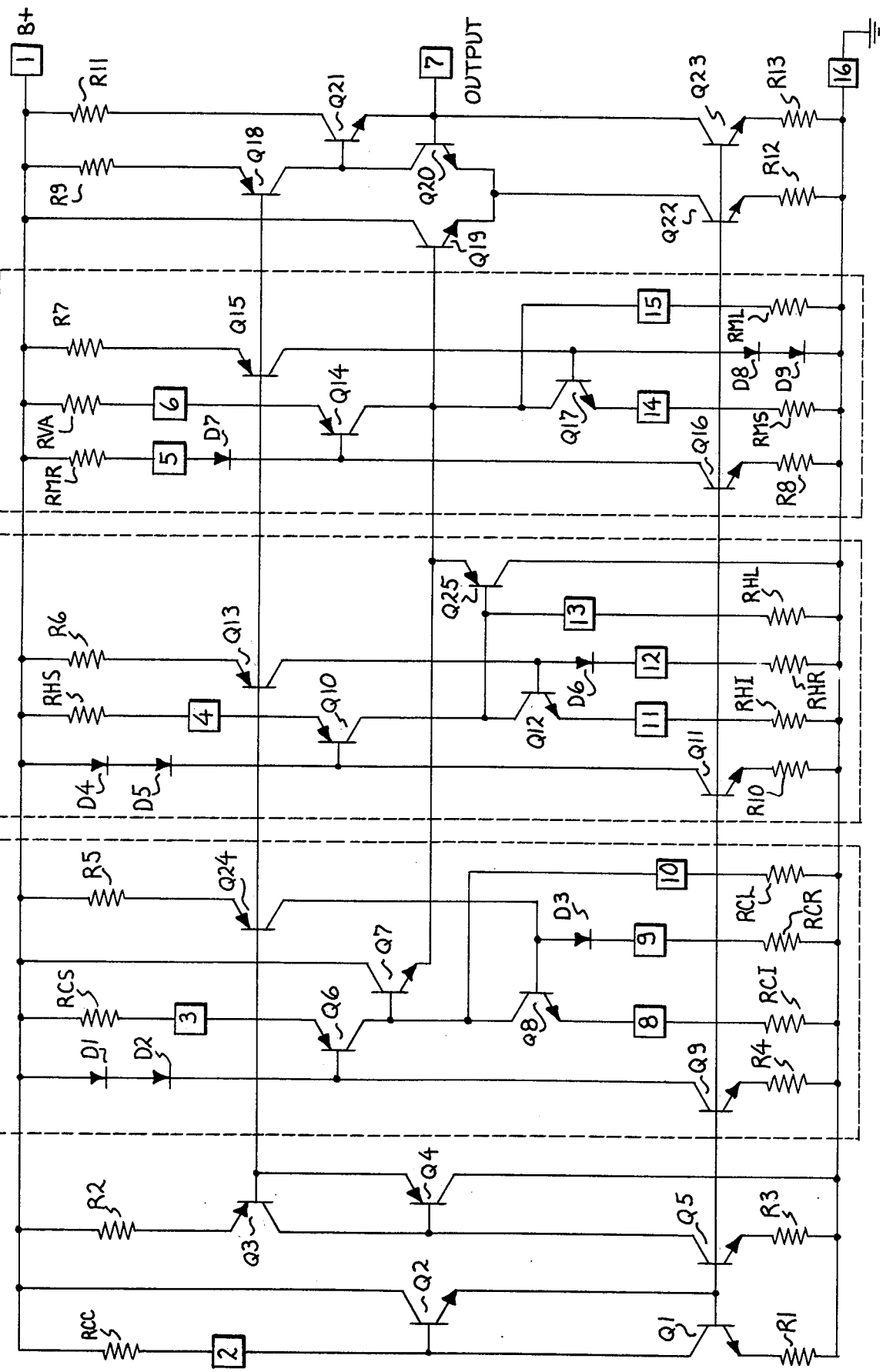
FIG. 2 shows a more detailed circuit diagram of my temperature compensator of FIG. 1.

FIG. 2 shows a more detailed circuit diagram of my compensator of FIG. 1. In FIG. 2, parts corresponding to those of FIG. 1 have been given the same reference numeral or designation. Thus, FIG. 2 includes the three circuits 20, 21, 22 enclosed in dashed lines. FIG. 2 also includes the voltage source terminal 1, the output terminal 7, and the ground terminal 16. As mentioned, my compensator can be constructed in integrated circuit form. However, adjustment or trimming of certain resistors is desirable or necessary, so that these resistors are made external to the integrated circuit. Hence, the circuit of FIG. 2 includes an additional number of terminals indicated by the squares containing a reference numeral. The resistors indicated by letters are provided externally to the integrated circuit and connected to these terminals so that they can be adjusted to give the compensator the desired characteristics. In this regard, bypass capacitors may be connected between selected ones of the terminals and the ground terminal to eliminate circulating currents and to facilitate adjustment and testing. These bypass capacitors are not shown so as to keep FIG. 2 as simple and clear as possible.

My compensator includes a plurality of current source circuits. The magnitudes of many of these current source circuits are determined by the current through a current control resistor RCC, the collector-emitter path of a transistor Q1, and an emitter-resistor R1. Setting the collector-emitter current of the transistor Q1 also sets the base-emitter voltage of the transistor Q1, and this in turn sets the base-emitter voltage for current source transistors Q5, Q9, Q11, Q16, Q22, Q23. The emitters of these last-mentioned transistors are connected through resistors R3, R4, R10, R8, R12, R13 to the ground terminal 16. These resistors determine the respective collector-emitter currents for the transistors Q5, Q9, Q11, Q16, Q22, Q23. The base currents for these transistors are provided by a transistor Q2. The collector of the transistor Q5 is connected to a current mirror circuit comprising transistors Q3, Q4, and a resistor R2. These transistors Q3, Q4 set the emitter-base voltages for the transistors Q24, Q13, Q15, Q18 and these emitter-base voltages also set the emitter-collector currents. The emitter resistors R5, R6, R7, R9 insure that the emitter-collector currents of the transistors Q24, Q13, Q15, Q18 are approximately equal to the emitter-collector current of the transistor Q3.

The differential amplifier of FIG. 1 is provided by transistors Q19, Q20. The emitter-collector current in the transistor Q18 is adjusted to be one-half of the current through the transistor Q22, so that the currents through the differential amplifier transistors Q19, Q20 are equal. Thus, the base voltage of the transistor Q20 (applied to the output terminal 7) follows the base voltage of the transistor Q19. The source transistors Q21, Q23 permit current to be supplied from the compensator to a load, or from the load back into the compensator as the output voltage varies up and down.

Figure 3:
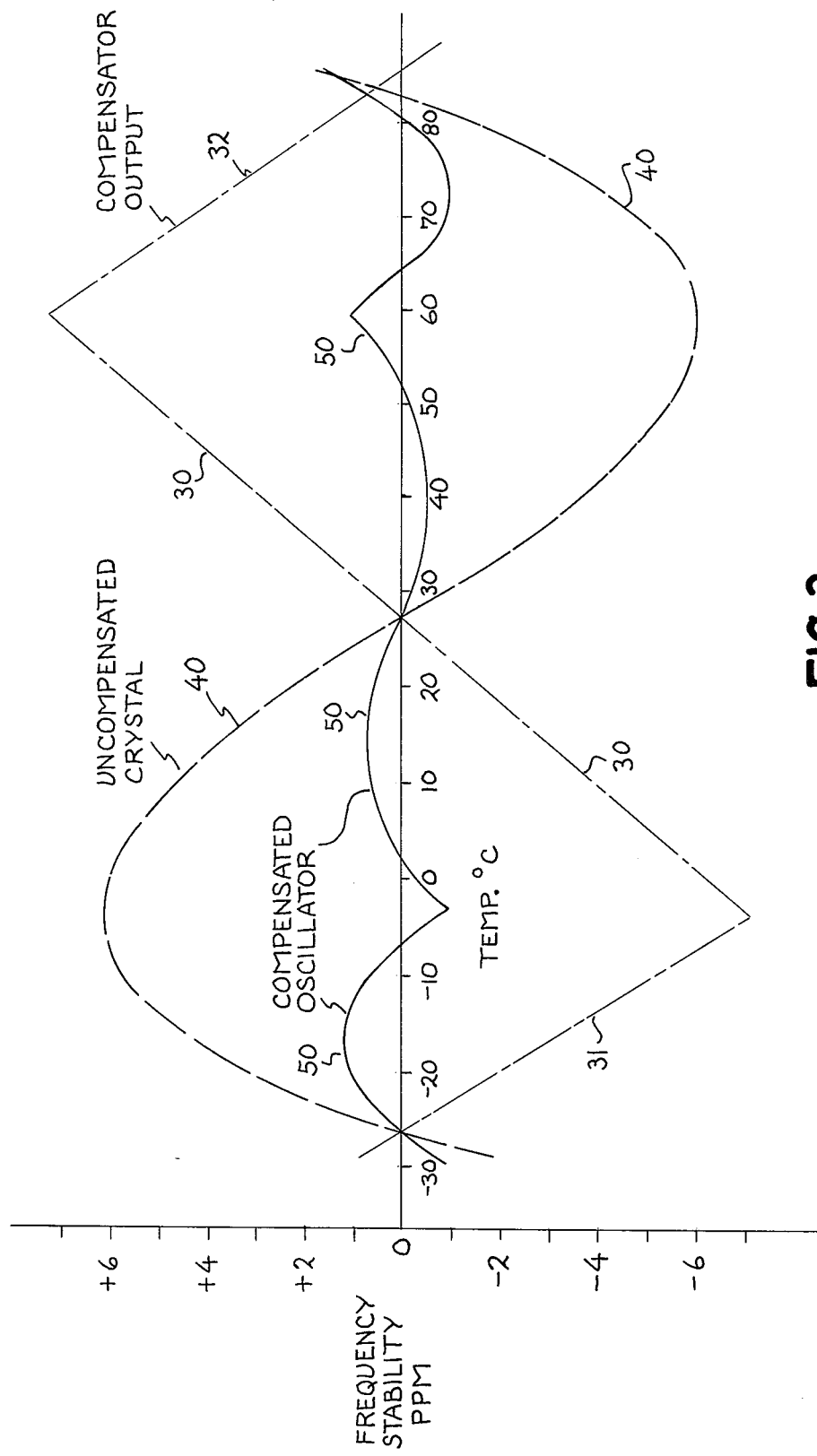
FIG. 3 shows curves illustrating the operation of my compensator over a temperature range.

In the middle temperature range circuit 22, a reference voltage is set by a middle range reference resistor RMR, a diode D7, the transistor Q16, and the resistor R8. This reference voltage is applied to the base of a transistor Q14 which, with a voltage adjusting resistor RVA, provides a current source circuit. This current source circuit is connected in series with a first path comprised of a transistor Q17 and middle slope resistor RMS, and in series with a load path comprised of the resistor RML. Once the resistors RMR, RVA, RMS are adjusted or trimmed, the magnitude of current through the source circuit (namely the emitter-collector path of the transistor Q14) becomes fixed. This current divides between the collector-emitter path of the transistor Q17 and the load resistor RML. The amount of current through the collector-emitter path of the transistor Q17 is determined by the voltage drop across two temperature sensing diodes D8, D9 connected to its base. These diodes D8, D9 are supplied with a fixed current from the transistor Q15. The voltage drop of one diode D8 is offset by the base-emitter voltage drop across the transistor Q17, so that the middle slope resistor RMS has a net voltage substantially equal to the voltage drop of the second diode D9. As the middle range temperature of the diodes D8, D9 falls or gets cooler, this voltage drop increases. This causes more current to flow through the first path comprised of the collector-emitter of the transistor Q17 and the middle slope resistor RMS. Hence, less current is available to flow through the load resistor RML, so that the voltage across the resistor RML falls with falling temperature. Conversely, as the temperature of the diodes D8, D9 increases or gets warmer, the voltage drop across the diodes falls. Less current flows through the slope resistor RMS and more current is available to flow through the load resistor RML. Hence, for warmer temperatures, the voltage across the load resistor RML increases. This is shown by the dashed and dotted curve 30 in FIG. 3. The slope of the curve 30 can be varied by adjusting the magnitudes of the slope resistor RMS and the load resistor RML. The midpoint of the curve 30 (i.e. where the compensator output voltage causes no variation in oscillator frequency) can be varied by adjusting the magnitudes of the resistors RMR, RVA. The voltage from the middle range circuit 22 is present at the terminal 15, and is applied to the output terminal 7 through the differential amplifier transistors Q19, Q20.

In the cold circuit 20, a current source circuit is provided by a current slope resistor RCS and a transistor Q6. This circuit is connected in series with a first path comprised of a transistor Q8 and intercept resistor RCI, and in series with a load path comprised of the resistor RCL. Current through the transistor Q8 is fixed by its base voltage which in turn is fixed by the transistor Q24 and a current reference resistor RCR. The magnitude of this source current is set or determined by the voltage drop across two temperature sensitive diodes D1, D2 connected to the base of the transistor Q6, and provided with current by a transistor Q9 and resistor R4. The diodes D1, D2 also produce a voltage drop which linearly decreases as temperature rises, and which linearly increases as temperature falls. The base-emitter voltage drop across the transistor Q6 is offset by the voltage drop across the diode D2, so that the slope resistor RCS has a net voltage drop of the diode D1 across it. As the temperature gets colder, this voltage drop increases which means that the transistor Q6 supplies more current. The current through the transistor Q8 is fixed by the transistor Q24 and resistor R5, so this additional current flows through the load resistor RCL. Thus, the voltage at the terminal 10 increases as the temperature gets colder. Conversely, as the temperature gets warmer, the voltage drop across the slope resistor RCS decreases and less current flows. This produces less current through the load resistor RCL so that the voltage at the terminal 10 falls with rising temperature. This is shown by the dashed and dotted curve 31 in FIG. 3. The slope of the curve 31 can be varied by adjusting the magnitudes of the slope resistor RCS and the load resistor RCL. The intercept of the curve 31 with the voltage where the compensator output voltage causes no variation in oscillator frequency or with the voltage of the curve 30 can be varied by adjusting the magnitude of the intercept resistor RCI. The voltage from the cold range circuit 20 is present at the terminal 10. This voltage is applied to the base of a buffer transistor Q7 whose emitter is connected to the differential amplifier transistor Q19. This cold range voltage prevails when it exceeds the middle range voltage provided by the middle range circuit 22.

In the hot circuit 21, operation is similar to the cold circuit 20 except that the hot circuit 21 is adjusted for the hotter temperatures. The current source circuit comprises the transistor Q10 and its hot slope resistor RHS. The current provided by this circuit is determined by the voltage drop and temperature of the diodes D4, D5. With the current through the transistor Q12 fixed by the reference resistor RHR, the current of the load resistor RHL varies with temperature. Specifically, the voltage at the terminal 13 increases with decreasing temperature and decreases with increasing or hotter temperature. These variations are shown by the dashed and dotted curve 32 of FIG. 3. The slope of the curve 32 can be varied by adjusting the magnitudes of the slope resistor RHS and the load resistor RHL. The intercept of the curve 32 can be varied by adjusting the magnitude of the intercept resistor RHI. The voltage from the hot range circuit 21 is present at the terminal 13. This voltage is applied to the base of a buffer transistor Q25 whose emitter is connected to the differential amplifier transistor Q19. This hot range voltage prevails over the middle range voltage when it falls below the middle range voltage.

A circuit was constructed according to FIG. 2 with the following values:
  Voltage Source — 5.4 volts
  Resistors R1 through R10 inclusive — 4000 ohms
  Resistor R11 — 500 ohms
  Resistor R12 — 2000 ohms
  Resistor R13 — 2000 ohms
  Resistor RCC adjusted to 80,000 ohms Middle circuit 22:
  Reference resistor RMR adjusted to 20,000 ohms
  Voltage adjust resistor RVA adjusted to particular crystal
  Slope resistor RMS adjusted to particular crystal
  Load resistor RML adjusted to 100,000 ohms Cold circuit 20:
  Slope resistor RCS adjusted to particular crystal
  Intercept resistor RCI adjusted to particular crystal
  Reference resistor RCR adjusted to 20,000 ohms
  Load resistor RCL adjusted to 100,000 ohms Hot circuit 21:
  Slope resistor RHS adjusted to particular crystal
  Intercept resistor RHI adjusted to particular crystal
  Reference resistor RHR adjusted to 20,000 ohms
  Load resistor RHL adjusted to 100,000 ohms These adjustments are aided with computer techniques which are familiar to persons skilled in the art. After these adjustments were made, the compensator output voltage followed the dashed and dotted line curves 31, 30, and 32 shown in FIG. 3. These curves have been plotted for FIG. 3 with respect to the frequency stability provided rather than the actual voltage. A typical uncompensated crystal characteristic is shown by the dashed line curve 40 in FIG. 3. The net compensation followed the solid line curve 50 of FIG. 3. The curve 50 represents the difference between the curve 40 and the curves 30, 31, 32. An examination of the curve 50 will show that a stability of ±2 ppm can be obtained over a temperature range between −30° C and +80° C. Such compensation is satisfactory in many applications, and is easily provided through my compensator. This compensator is relatively easy to construct and because it utilitizes modern integrated circuit techniques and trimming. While I have shown only one embodiment of my invention, persons skilled in the art will appreciate the modifications which can be made. In particular, my circuit is not intended to be limited to any particular temperature ranges, voltages, or slopes. While my compensator functions well without thermistors, thermistors can be used to replace either or both load resistors RCL, RHL and provide a different compensation voltage. My compensator can be switched on and off by opening and closing the lead to the current resistor RCC. When open, my compensator draws no current. When closed, my compensator functions at once. Such a feature is desirable where only one of several oscillators is turned on at any one time. Therefore, while my invention has been described with reference to a particular embodiment, it is to be understood that modifications may be made without departing from the spirit of the invention or from the scope of the claims.

What I claim as new and desire to secure by Letters of the United States is:

1. An improved temperature compensator for use with a crystal oscillator operating in a cold range, a middle range, and a hot range of temperature, said oscillator having at least one voltage sensitive capacitor associated therewith, said improved temperature compensator comprising:
   a. voltage source terminals;
   b. compensating voltage output terminals for connection to said voltage sensitive capacitor;
   c. a middle temperature range compensating circuit comprising a current source circuit connected between said source voltage terminals, said current source circuit having a first path and a load path in series therewith, and temperature sensitive diode means connected to said first path for increasing the current through said load path in response to warmer temperatures and for decreasing the current through said load path in response to cooler temperatures;
   d. a cold temperature range compensating circuit comprising a current source circuit connected between said voltage source terminals, said current source circuit having a first path and a load path in series therewith, and temperature sensitive diode means connected to said current source circuit for increasing the current through said load path in response to colder temperatures and for decreasing the current through said load path in response to warmer temperatures;
   e. a hot temperature range compensating circuit comprising a current source circuit connected between said voltage source terminals, said current source circuit having a first path and a load path in series therewith, and temperature sensitive diode means connected to said current source circuit for decreasing the current through said load path in response to hotter temperatures and for increasing the current through said load path in response to cooler temperatures;
   f. and means connected to each of said load paths for deriving middle, cold, and hot signals therefrom.

2. The improved compensator of claim 1 wherein said deriving means include means for causing the cold signal to prevail over the middle signal in response to a colder temperature that raises the current through said cold circuit load path above a selected magnitude, and include means for causing the hot signal to prevail over the middle signal in response to a hotter temperature that lowers the current through said hot circuit load path below a selected magnitude.

3. The improved compensator of claim 1 wherein said first path and said load path of each compensating circuit are respectively connected in a parallel circuit, and each parallel circuit is connected in series with its respective current source circuit.

4. The improved compensator of claim 1 wherein said first path and said load path of each compensating circuit are respectively connected in a parallel circuit, and each parallel circuit is connected in series with its respective current source circuit; and wherein said deriving means include means for causing the cold signal to prevail over the middle signal in response to a colder temperature that raises the current through said cold circuit load path above a selected magnitude, and include means for causing the hot signal to prevail over the middle signal in response to a hotter temperature that lowers the current through said hot circuit load path below a selected magnitude.

5. An improved circuit for supplying compensating voltages to a voltage sensitive capacitor for determining the resonant frequency of an oscillator or the like, over cold, middle, and hot temperature ranges, said improved circuit comprising:
   a. voltage source terminals for said improved circuit;
   b. output terminals for said improved circuit;
   c. a middle temperature range compensating circuit comprising a variable current path and a load path connected in parallel and further connected between said voltage source terminals, said variable current path including temperature sensitive diodes that cause said variable current path to draw more current and decrease the current through said load path in response to decreasing temperatures, and that cause said variable current path to draw less current and increase the current through said load path in response to increasing temperatures;
   d. a cold temperature range compensating circuit comprising a variable current path and a load path connected in series and further connected between said voltage source terminals, said variable current path including temperature sensitive diodes that cause said variable current path to draw more current and increase the current through said load path in response to decreasing temperature and that cause said variable current path to draw less current and decrease the current through said load path in response to increasing temperature;
   e. a hot temperature range compensating circuit comprising a variable current path and a load path connected in series and further connected between said voltage source terminals, said variable current path including temperature sensitive diodes that cause said variable current path to draw more current and increase the current through said load path in reponse to decreasing temperature and that cause said variable current path to draw less current and decrease the current through said load path in response to increasing temperature;

f. and means connected to said load paths for deriving voltage signals therefrom.

6. The improved circuit of claim 5 wherein said cold circuit includes means for causing the voltage across its load path to rise above the voltage across said middle range circuit load path below a first predetermined temperature, wherein said hot circuit includes means for causing the voltage across its load path to fall below the voltage across said middle range circuit load path above a second predetermined temperature, and wherein said deriving means respond only to said voltage across said cold load path below said first temperature, respond only to said voltage across said middle load path between said first and second temperatures, and response only to said voltage across said hot load path above said second temperature.

7. The improved circuit of claim 5 wherein said variable current path of said middle range circuit comprises a series resistor and a transistor having its base connected to said temperature sensitive diodes, wherein said variable current path of said cold range circuit comprise a series resistor and transistor having its base connected to said temperature sensitive diodes, and wherein said variable current path of said hot range circuit comprise a series resistor and transistor having its base connected to said temperature sensitive diodes.

8. The improved circuit of claim 7, and further comprising a buffer transistor connected between cold load resistor and said deriving means, and a buffer transistor connected between hot load resistor and said deriving means.

9. The improved circuit of claim 8 wherein said cold circuit includes means for causing the voltage across its load path to rise above the voltage across said middle range circuit load path below a first predetermined temperature, wherein said hot circuit includes means for causing the voltage across its load path to fall below the voltage across said middle range circuit load path above a second predetermined temperature, and wherein said deriving means respond only to said voltage across said cold load path below said first temperature, respond only to said voltage across said middle load path between said first and second temperatures, and respond only to said voltage across said hot load path above said second temperature.

10. An improved circuit for supplying compensating voltages to a voltage sensitive capacitor for determining the resonant frequency of an oscillator or the like over cold, middle, and hot temperature ranges, said improved circuit comprising:
 a. voltage source terminals for said improved circuit;
 b. output terminals for said improved circuit;
 c. a middle temperature range circuit connected between said source terminals and including adjustable resistors and temperature sensitive diodes connected to produce a middle range voltage that varies linearly in a first direction with increasing temperature and that varies linearly in a second direction opposite said first direction with decreasing temperature;
 d. a cold temperature range circuit connected between said source terminals and including adjustable resistors and temperature sensitive diodes connected to produce a cold voltage that varies linearly in said second direction with increasing temperature and that varies linearly in said first direction with decreasing temperature;
 e. a hot temperature range circuit connected between said source terminals and including adjustable resistors and temperature sensitive diodes connected to produce a hot voltage that varies linearly in said second direction with increasing temperature and that varies linearly in said first direction with decreasing temperature;
 f. and means connected to said circuits for deriving said middle, cold, and hot voltages, said cold circuit voltage blocking said middle circuit voltage below a first temperature, and said hot circuit voltage blocking said middle circuit voltage above a second temperature higher than said first temperature.

11. The improved circuit of claim 10 wherein said first direction of voltage variation is an increasing voltage; wherein said second direction of voltage variation is a decreasing voltage; wherein an increasing cold circuit voltage blocks a decreasing middle circuit voltage below said first temperature; and wherein a decreasing hot circuit voltage blocks an increasing middle circuit voltage above said second temperature.

12. The improved circuit of claim 11 wherein said adjustable resistors of said middle temperature range circuit determine the zero frequency compensation and slope of said middle range voltage; wherein said adjustable resistors of said cold temperature range circuit determine the zero frequency compensation and slope of said cold range voltage; and wherein said adjustable resistors of said hot temperature range circuit determine the zero frequency compensation and slope of said hot range voltage.

* * * * *